(12) United States Patent
Speer et al.

(10) Patent No.: US 9,335,034 B2
(45) Date of Patent: May 10, 2016

(54) FLEXIBLE CIRCUIT BOARD FOR ELECTRONIC APPLICATIONS, LIGHT SOURCE CONTAINING SAME, AND METHOD OF MAKING

(71) Applicants: Richard Speer, Concord, MA (US);
Adam Scotch, Amesbury, MA (US);
Jeffery Serre, Peabody, MA (US);
Sridharan Venk, Salem, MA (US)

(72) Inventors: Richard Speer, Concord, MA (US);
Adam Scotch, Amesbury, MA (US);
Jeffery Serre, Peabody, MA (US);
Sridharan Venk, Salem, MA (US)

(73) Assignee: OSRAM SYLVANIA INC, Wilmington, MA (US)

( * ) Notice: Subject to any disclaimer, the term of this patent is extended or adjusted under 35 U.S.C. 154(b) by 264 days.

(21) Appl. No.: 14/040,578

(22) Filed: Sep. 27, 2013

(65) Prior Publication Data
US 2015/0092429 A1     Apr. 2, 2015

(51) Int. Cl.
| H05K 1/00 | (2006.01) |
| F21V 21/14 | (2006.01) |
| F21K 99/00 | (2016.01) |
| H05K 1/02 | (2006.01) |
| H05K 1/18 | (2006.01) |
| H01L 33/62 | (2010.01) |
| H05K 1/03 | (2006.01) |
| H05K 3/28 | (2006.01) |

(52) U.S. Cl.
CPC . *F21V 21/14* (2013.01); *F21K 9/90* (2013.01); *H01L 33/62* (2013.01); *H05K 1/0281* (2013.01); *H05K 1/189* (2013.01); *H01L 2224/48091* (2013.01); *H01L 2224/48247* (2013.01); *H01L 2933/0066* (2013.01); *H05K 1/0393* (2013.01); *H05K 3/284* (2013.01); *H05K 2201/0145* (2013.01); *H05K 2201/10106* (2013.01); *H05K 2201/2009* (2013.01); *Y10T 29/49133* (2015.01)

(58) Field of Classification Search
CPC ... F21K 9/90; F21V 21/14; H01L 2933/0066; H01L 33/62; H05K 1/0281; H05K 1/0393; H05K 1/189; Y10T 29/49133
USPC .......... 174/254, 258, 260, 261; 361/749, 750, 361/760, 767
See application file for complete search history.

(56) References Cited

U.S. PATENT DOCUMENTS

| 5,810,604 A | 9/1998 | Kopp, Jr. et al. |
| 2003/0107316 A1* | 6/2003 | Murakami ............. H01L 24/97 313/512 |

(Continued)

FOREIGN PATENT DOCUMENTS

| DE | 10 2011 016 566 | 9/2012 |
| WO | WO 2007/089599 | 8/2007 |
| WO | WO 2013/082537 | 6/2013 |

*Primary Examiner* — Yuriy Semenenko
(74) *Attorney, Agent, or Firm* — Robert F. Clark

(57) ABSTRACT

A flexible circuit board is described that includes a flexible substrate, at least one ridge defining a flexion zone and a component mounting area. The flexion zone acting to dissipate at least a portion of a force applied to the substrate, so as to insulate the component mounting area from the force. Light sources using such flexible circuit boards and methods for making such circuit boards are also described.

14 Claims, 5 Drawing Sheets

(56) References Cited

U.S. PATENT DOCUMENTS

| | | | |
|---|---|---|---|
| 2007/0177380 A1* | 8/2007 | Schultz | H05K 1/0203 362/249.01 |
| 2011/0037179 A1 | 2/2011 | Limaye et al. | |
| 2012/0002376 A1 | 1/2012 | Suzuki et al. | |
| 2012/0049724 A1* | 3/2012 | Nakai | H01L 51/5271 313/498 |
| 2013/0126935 A1 | 5/2013 | Zitzlsperger et al. | |
| 2013/0309788 A1 | 11/2013 | Brandl et al. | |
| 2014/0239318 A1* | 8/2014 | Oyu | H01L 33/62 257/88 |
| 2014/0331532 A1* | 11/2014 | Deppiesse | F21S 4/005 40/541 |
| 2015/0049444 A1* | 2/2015 | Venk | F21S 4/005 361/749 |

\* cited by examiner

FLEXIBLE CIRCUIT BOARD FOR ELECTRONIC APPLICATIONS, LIGHT SOURCE CONTAINING SAME, AND METHOD OF MAKING

TECHNICAL FIELD

The present disclosure relates to flexible substrates for lighting and electronics applications, components thereof, and methods for manufacturing the same.

BACKGROUND

Light sources such as incandescent and fluorescent sources are increasingly being replaced by light emitting diode sources (hereafter, LED or LEDs). In many instances an LED light source includes a plurality of LED packages, wherein each package includes one or more LED chips. The LED package may include a plastic body that surrounds a lead frame that is configured to allow electrical connections to the LED chip(s). The body may be configured such that a volume remains above the LED chip. In some instances that volume may be filled with a wavelength conversion material (e.g., a phosphor) or another material that may affect the wavelength or other characteristics of the light emitted from the LED chip.

In many instances, LED packages are mounted on a circuit substrate that is made of relatively stiff material such as fiber reinforced epoxy (e.g., FR4) or polyimide. The circuit substrate is generally processed to bear conductive traces and/or other components of a printed circuit on a surface thereof. LED packages may be mounted or otherwise coupled to the traces to produce a lighting array. Although such lighting arrays are useful, the use of relatively stiff circuit substrates may impose design limitations. Technology has therefore been developed to permit the use of circuit substrates that are manufactured from flexible materials such as plastics.

In many instances, a conductive epoxy or other adhesive may be used to adhere the LED package to the substrate and maintain electrical contact between the LED package and traces on the substrate. While this approach is useful in low stress applications, flexion of the substrate may cause the adhesive to crack, potentially compromising the electrical connection between the LED package and corresponding electrical traces. Accordingly, there remains in need in the art for improved technologies for securing LED packages to flexible substrates.

Furthermore while packaging LED chips into an LED package is well established, the cost of packaging can greatly increase the cost of final products into which the LED packages are incorporated. It would therefore be an advance in the art if the need to package LED chips could be eliminated. Simplified placement of LED packages and/or LED chips on flexible substrates may also be desired.

SUMMARY OF THE INVENTION

It is an object of the invention to obviate the disadvantages of the prior art.

It is another object of the invention to provide a flexible circuit board for mounting electrical components, such as light emitting diodes, and in particular a flexible substrate that can be used in roll-to-roll manufacturing processes.

It is a further object of the invention to provide a light source comprising a flexible circuit board, and in particular a light source comprising LED chips mounted within a protected mounting area wherein the electrical connections are insulated from forces applied when the substrate is flexed.

It is still another object of the invention to provide a method for making a circuit board.

In accordance with one object of the invention, there is provided a circuit board, comprising a flexible substrate having a circuit, said circuit comprising electrical traces for electrically coupling to an electronic component in a component mounting area; and a ridge defining a flexion zone in said substrate proximate to said component mounting area, said ridge substantially surrounding said component mounting area, said flexion zone configured to insulate said component mounting area from a force imposed on said substrate.

In accordance with another object of the invention, there is provided a light source comprising a circuit board comprising a flexible substrate with at least one circuit and at least one component mounting area, said at least one circuit including at least first and second electrical leads, said substrate further comprising a ridge defining a flexion zone in said substrate proximate to said component mounting area, said ridge substantially surrounding said component mounting area, said flexion zone configured to insulate said component mounting area from a force imposed on said substrate; and a light emitting component positioned within said at least one component mounting area and electrically coupled to said first and second electrical leads.

In accordance with another object of the invention, there is provided a method of making a light source, comprising:
  forming a ridge defining a flexion zone proximate to a component mounting area in a circuit board, said ridge substantially surrounding said component mounting area, the circuit board comprising a flexible substrate with at least one circuit associated therewith, said component mounting area comprising first and second electrical leads; and
  positioning a light emitting component within said component mounting area and electrically coupling said light emitting component to said first and second electrical leads;
  wherein said ridge is formed by mechanically deforming said flexible substrate to define said component mounting area and said flexion zone is configured to insulate said component mounting area from a force imposed on said substrate.

In accordance with another aspect of the invention, the ridge is formed by mechanically deforming the flexible substrate without the application of heat to the substrate. Preferably, the substrate is comprised of biaxially oriented polyethylene terephthalate.

BRIEF DESCRIPTION OF THE DRAWINGS

Reference is now made to the following detailed description which should be read in conjunction with the following figures.

DETAILED DESCRIPTION

Figure 1:
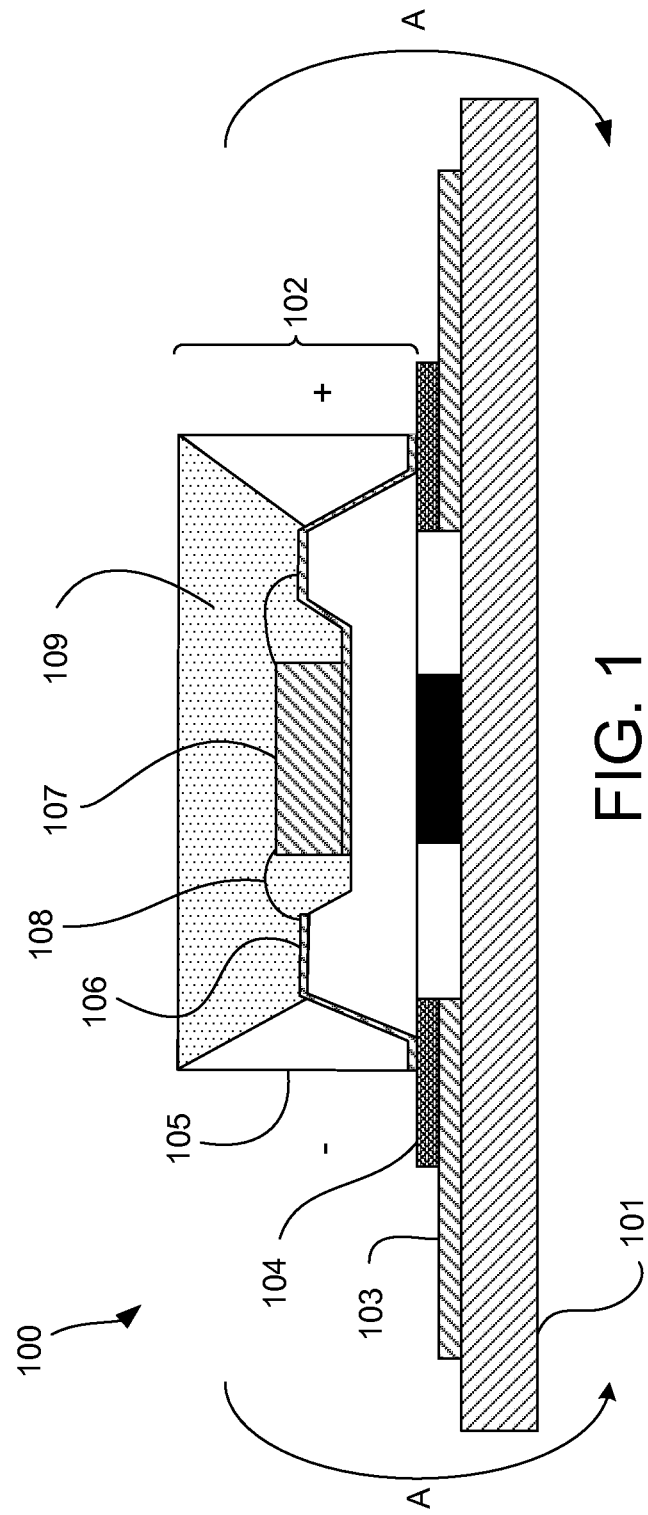
FIG. 1 is a cross sectional view of an LED package mounted on a circuit substrate consistent with the prior art.

As used herein the terms "about" and "substantially" when used in connection with a numerical value or range, mean+/− 5% of the recited numerical value or range.

One or more aspects of the present disclosure may be described using numerical ranges. Unless otherwise indicated herein, any recited range should be interpreted as including any and all iterative values between indicated endpoints, as if such iterative values were expressly recited. Such ranges should also be interpreted as including any and all ranges falling within or between such iterative values and/or recited endpoints, as if such ranges were expressly recited.

For purpose of the present disclosure it is to be understood that when one element or layer (first element) is referred to as being "on," connected to" or "coupled to" another element or layer (second element), the first element may be directly on, connected to or coupled to the second element, or one or more intervening elements or layers may be present between the first and second elements. In contrast, when an first element is referred to as being "directly on," "directly connected to" or "directly coupled to" a second element, no intervening elements or layers present are present between the first and second elements.

As used herein the term "and/or" includes any and all combinations of one or more of an associated list of items.

For the sake of clarity the terms "first," "second," "third" etc. may be used to describe various elements, components, regions, layers and/or sections. It should be understood that this is for the sake of explanation only, and that such elements components, regions, layers and/or sections are not to be limited by such terms. Thus for example a first element, component, region, layer or section could be termed a second element, component, region, layer or section without departing from the scope and teachings of the present invention.

Spatially relative terms, such as "beneath," below," upper," "lower," "above" and the like may be used herein for ease of description to describe one element or feature's relationship to another element(s) or feature(s) as illustrated in the drawings. These spatially relative terms are intended to encompass different orientations of the device in use or operation in addition to the orientation shown in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. For example, the singular terms "a," "an" and "the" are intended to include their plural forms as well, unless the context clearly indicates otherwise.

An LED "die" (also referred to as an LED "chip") is an LED in its most basic form, i.e., in the form of the small individual pieces produced by dicing the much larger wafer onto which the semiconducting layers were deposited. The LED die can include contacts suitable for the application of electric power.

References to the color of a phosphor, LED or conversion material refer generally to its emission color unless otherwise specified. Thus, a blue LED emits a blue light, a yellow phosphor emits a yellow light and so on.

As used herein, the term "flexible substrate" means that the substrate is capable of mechanically bending to such a degree that it can be rolled onto a 2-inch diameter cylinder without cracking or breaking.

Reference is now made to FIG. 1, which is a cross sectional view of a light source 100 consistent with the prior art. As shown, light source 100 includes LED package 102, which is mounted on substrate 101. Substrate 101 includes traces 103 on a surface thereof. Generally, traces may be formed of electrically conductive material such as copper, silver, etc., and may be patterned and/or deposited on substrate 101 in accordance with an electrical circuit such as may be used in conjunction with LED package 102.

In the illustrated embodiment, LED package 102 includes an insulating package body 105, which may be manufactured from plastic or another insulating material. Lead frame 106 may extend through body 105 so as to permit electrical contact between traces 103 and components within body 105, in this case LED chip 107. In this case, LED chip 107 is shown as being electrically connected to lead frame 106 via wire bonds 108. In turn, lead frame 106 is electrically coupled to traces 103, e.g., via electrically conductive adhesive 104. A volume (not labeled) above LED chip 107 and within body 105 may be filled with wavelength conversion material 109. Wavelength conversion material may for example include a silicone binder with phosphor particles incorporated therein. In general, wavelength conversion material 109 may convert at least a portion of light emitted from LED chip 107, e.g., by converting such light from a first wavelength or wavelength range to at least one second wavelength or wavelength range.

As described previously, light sources such as the one shown in FIG. 1 are useful in low stress applications where the bond between adhesive 104 and one or both of traces 103 and lead frame 106 is not subject to significant stress. Such applications may be typical for example, where substrate 101 is made of a relatively rigid material such as fiber reinforced epoxy, glass, silicon, and the like. When substrate 101 is flexible however, stresses imparted by movement of the substrate may cause the bond between adhesive 104 and one or both of traces 103 and lead frame 106 to crack and/or fail. This may be particularly problematic in instances where substrate 101 is subject to bending forces such as bending force A shown in FIG. 1. Such forces have a tendency to put significant stress on the bond between adhesive 104 and one or more of traces 103 and lead frame 106, potentially resulting in cracking and/or failure of the bond. This may result in a loss of electrical connectivity between LED package 102 and traces 103, which may compromise the operability of LED chip 107.

Manufacturing an LED light source such as the one shown in FIG. 1 may also require numerous and time consuming steps. For example, manufacturing of light source 100 may entail: molding package body 105 within/around lead frame 106; wire bonding LED chip 107 into body 105; filing body 105 with wavelength conversion material 109; testing and binning packages 102; loading packages 102 onto a roll for an end user; and placing packages 102 one by one at their proper locations on substrate 101. This may increase the cost and complexity of manufacturing and thus, the cost of the final product into which light source 100 may be incorporated.

With the foregoing in mind, one aspect of the present disclosure generally relates to flexible substrates for electronic components, and in particular to flexible substrates for mounting lighting components such an LED package or chip. As will be described below, in some embodiments the substrates of the present disclosure may be configured to replace the package body and/or lead frame that is often used in prior art devices to house electrical components such as LED chips. In such instances the substrate itself may provide one or more mounting locations for electrical components such as LED chips, which may be connected to electrical traces on a surface of or within the substrate. Alternatively or additionally, the substrates described herein may provide mounting locations for one or more component packages such as an LED package, in which case the package may be coupled via wire bonding, soldering, or another technique to contacts on a surface of the substrate.

In any case, one or more flexion zones may be formed in the substrates of the present disclosure, e.g., in a location surrounding or otherwise proximate to a mounting location for an electronic component. Such flexion zones may be configured to enhance retention of an electronic component within a mounting area, even when the substrate is flexed or otherwise subject to bending or other forces. The substrates described herein may also streamline manufacturing, e.g., by reducing the number of steps needed to place and bond an electronic component to a flexible substrate.

Figure 2:
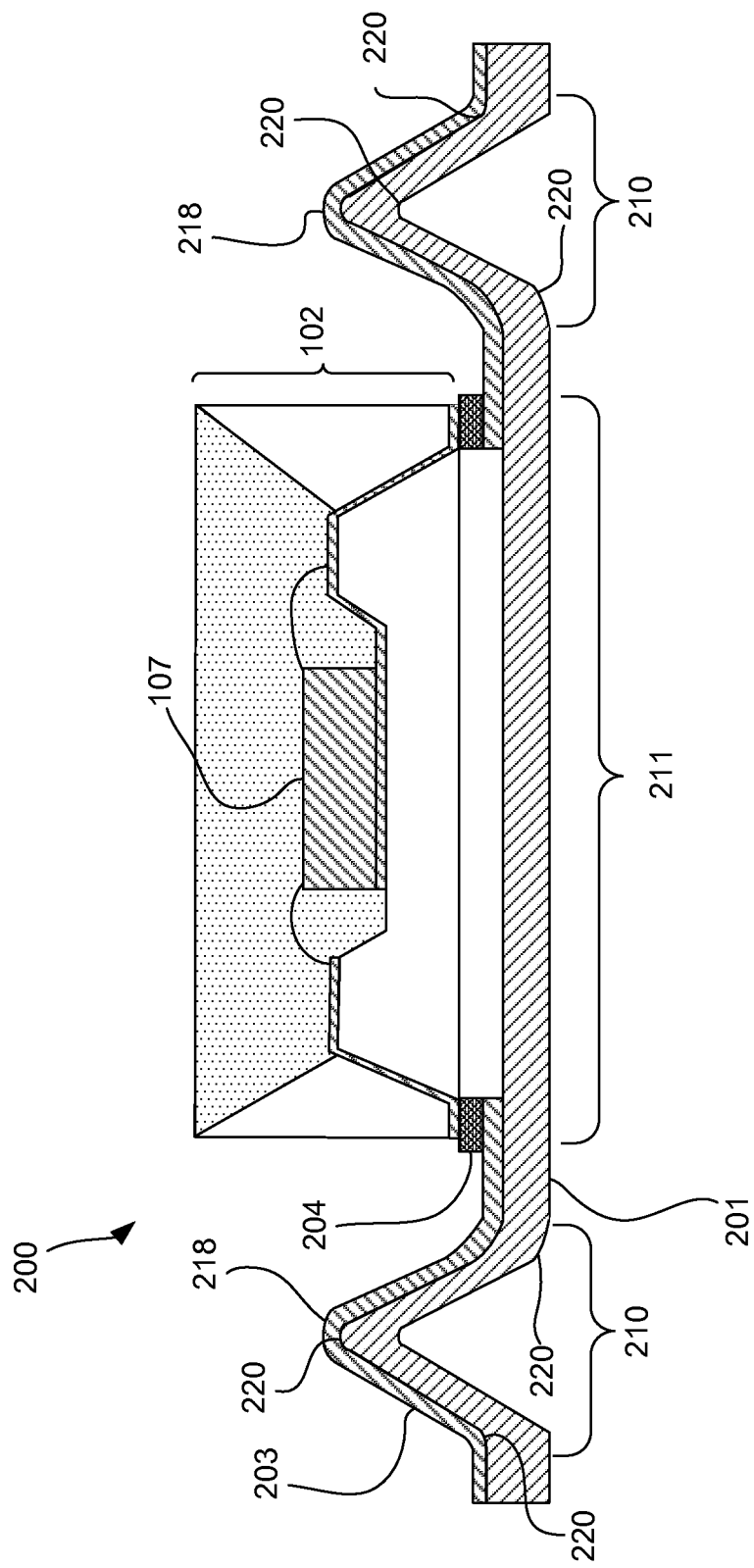
FIG. 2 is a cross sectional view of an exemplary light source including an LED package mounted on a circuit substrate consistent with the present disclosure.

Reference is now made to FIG. 2, which depicts a cross sectional diagram of an exemplary light source consistent with the present disclosure. As shown, light source 200 includes flexible substrate 201 having traces 203 corresponding to at least one circuit on a surface thereof. Substrate 201 includes ridge 218, which has a corresponding inner and outer surface (not labeled). As will be described in detail below, ridge 218 may define a component mounting area 211 (hereinafter referred to as a "mounting area"), in this case for LED package 102. LED package 102 may be placed within mounting area 211 and bonded to traces 203, e.g., using conductive adhesive 204. This concept is shown in FIG. 2, wherein the lead frame of package 102 is bonded to traces 203 via conductive adhesive 204.

Substrate 201 may be any substrate that is suitable for use as a flexible substrate for a light source or other electronic device. Substrate 201 may therefore be in the form of a flexible sheet, a woven and/or non-woven material, a flexible composite, combinations thereof, and the like. In any case, the substrates may be formed from any suitably flexible material, such as a polymer, a polymer composite, a polymer fiber composite, a metal, a laminate, or a combination thereof. Preferably, the substrates described herein are formed from a polymer or other electrically insulating material. Non-limiting examples of suitable polymer materials that may be used to form such sheets include shapeable polymers such as polyethylene (PE), polypropylene (PP), polyethylene terephthalate (PET), poyethylene napthalate (PEN), polyether ether ketone (PEEK), polyimide (PI), polyamides, combinations thereof, and the like. Without limitation, substrate 201 is preferably in the form of a polymer sheet, such as a PET or polyimide sheet. In some embodiments, substrate 201 is a sheet of biaxially or monoaxially oriented PET.

The term "shapeable" when used in connection with a substrate indicates that the substrate may be deformed (e.g., by embossing, debossing, molding, thermoforming, combinations thereof, and the like) so as to form one or more depressions therein and/or protrusions thereon. Without limitation, the substrates described herein are preferably formed from materials that may support conductive traces, and which may be shaped without impacting or substantially impacting the conductivity and/or connectivity of the conductive traces.

In some embodiments, substrate 201 may exhibit high reflectivity with respect to light emitted from LED chip 107. Thus for example, substrate 201 may reflect greater than or equal to about 80%, 85%, 90%, 95%, 99%, or even 100% of the light emitted from LED chip 107. Without limitation, substrate 201 preferably reflects greater than or equal to about 95,%, 99%, or even 100% of light emitted from LED chip 107. As non-limiting examples of substrate materials which may exhibit such reflectively, mention is made of polyolefins such as polyethylene and polypropylene, and polyesters such as PET.

Figure 7:
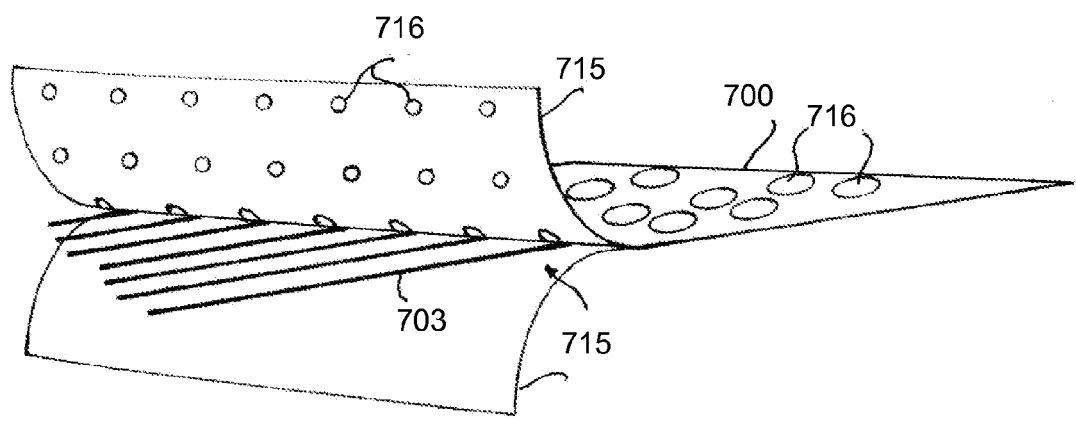
FIG. 7 depicts a laminate substrate consistent with the present disclosure.

In some embodiments, substrate 201 may be a laminate substrate. In this regard, reference is made to FIG. 7, which illustrates an exemplary laminate substrate consistent with the present disclosure. As shown, substrate 700 includes one or more circuit components (e.g., traces 703) sandwiched between electrically insulating layers 715. Insulating layers 715 may be formed of any electrically insulating material, such as but not limited to non-conductive polymers and composites. In some embodiments, insulating layers are each formed from the same non-conductive polymer material. Non-limiting examples of non-conductive polymer materials that may be used to form insulating layers 715 include polyolefins such as polyethylene and polypropylene, polyesters such as PET, polyimides, and combinations thereof. Without limitation, insulating layers 715 are preferably formed from PET.

In any case, insulating layers 715 may include circuit access openings 716, which may enable access and/or electrical contact to traces 703. Alternatively or additionally, components to be mounted on substrate 701 may include mounting points to penetrate one or both of insulating layers 715, so as to make electrical contact with traces 703.

In any case, the substrates described herein are preferably formed from a material that may be deformed to include at least one ridge and at least one mounting area, as described later.

Returning to FIG. 2, traces 203 may be formed of any material with conductivity that is sufficient for electrical applications, e.g., for use as conductive traces of a circuit. Thus for example, traces 203 may be formed of a metal such as copper, silver, gold, aluminum, or the like, which may be printed, deposited, and/or plated on a surface of substrate 101 so as to correspond to a desired pattern of a circuit. Alternatively or additionally, traces 203 may be formed by printing or depositing a conductive ink on a surface of substrate 101. In some embodiments, the conductive ink may include a binder material that is loaded with particles of conductive material such as silver, gold, copper, aluminum, and the like. Without limitation, traces 203 are preferably formed by depositing a conductive silver ink on a surface of substrate 101, e.g., as shown in FIG. 2.

Adhesive 204 may be any suitable adhesive for electrically coupling and/or physically bonding traces 203 to corresponding contacts of package 102. In this regard, any suitable electrically conductive adhesive may be used. Without limitation, adhesive 204 is preferably in the form of a conductive epoxy. In such instances the conductive epoxy may include an epoxy binder containing conductive particles, such as particles of silver, gold, copper, or the like. The particles may be present in the epoxy in sufficient quantity to render adhesive 204 conductive.

As the embodiment of FIG. 2 is exemplary it should be understood that adhesive 204 need not be a conductive adhesive, and that other mechanisms for electrically connecting package 102 with traces 203 may be used. By way of example, adhesive 204 may be any suitable adhesive for physically bonding package 102 to traces 203 and/or substrate 201, such as an epoxy or silicone adhesive. Contacts (not labeled) of package 102 may in such embodiments be electrically coupled to traces 203 using any suitable means, such as via wire bonding, die bonding, soldering, combinations thereof, and the like (all not shown). Regardless of its nature, adhesive 104 may serve to bond package 102 within mounting area 211 of substrate 201.

LED package 102 may be any suitable LED package. For the sake of example, package 102 is illustrated in FIG. 2 in the form of a Duris E5 LED package, which is available from OSRAM Opto Semiconductors. Of course this illustration is exemplary only, and any suitable LED package may be used. It should also be understood that package 102 is not limited to LED or other lighting packages, and may be any electronic component (e.g., a surface mount component) for which mounting on a flexible substrate may be desired.

Figure 4:
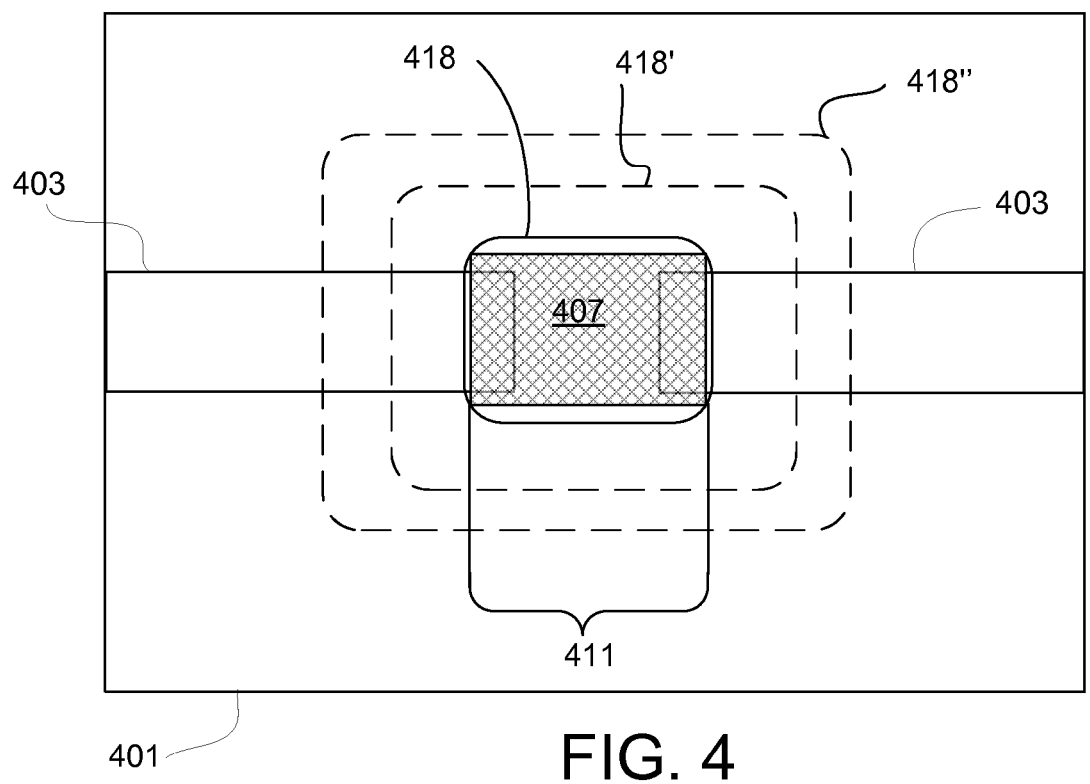
FIGS. 4 and 5 are top down views of mounting locations on substrates consistent with the present disclosure.
Figure 5:
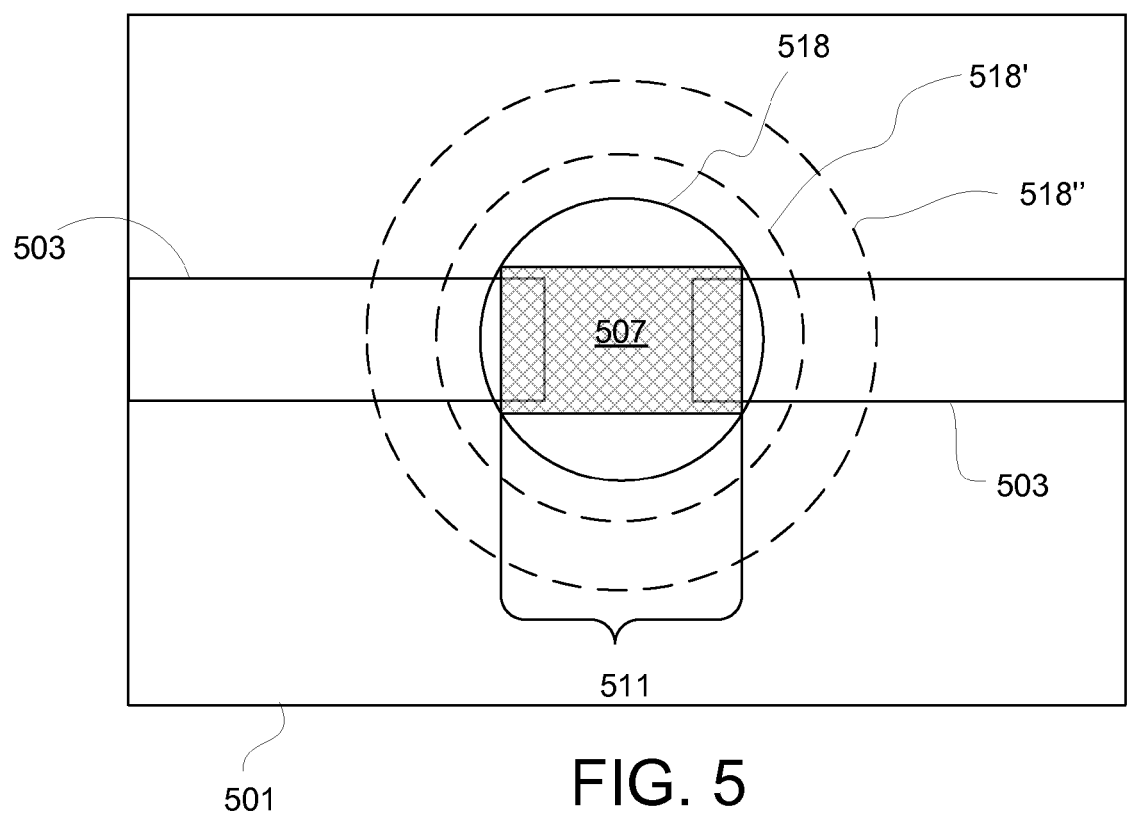

Mounting area 211 may be configured to house an electronic package such as LED package 102, and/or a bare electronic component such as an LED chip. In some embodiments, mounting area 211 may be configured such that it has a desired geometry when viewed from the top down. Thus for example mounting area 211 may exhibit a circular, non-circular (e.g., rectangular), and/or irregular profile when view from the top down, as generally shown in FIGS. 4 and 5. Of course such profiles are exemplary only, and it should be understood that mounting area 211 may have any desired shape or profile.

In some embodiments one or more portions of mounting area 211 may be configured to contact, mate, and/or couple with corresponding portions of an electronic package and/or bare electronic component. Thus for example, mounting area 211 may include one or more corners which are configured to mechanically engage with an electronic package such as LED package 102 and/or a bare component such as LED chip 307 in FIG. 3. In such instances, mechanical engagement of mounting area 211 to the package and/or component may enhance retention of the package and/or component within mounting area 211.

Figure 3:
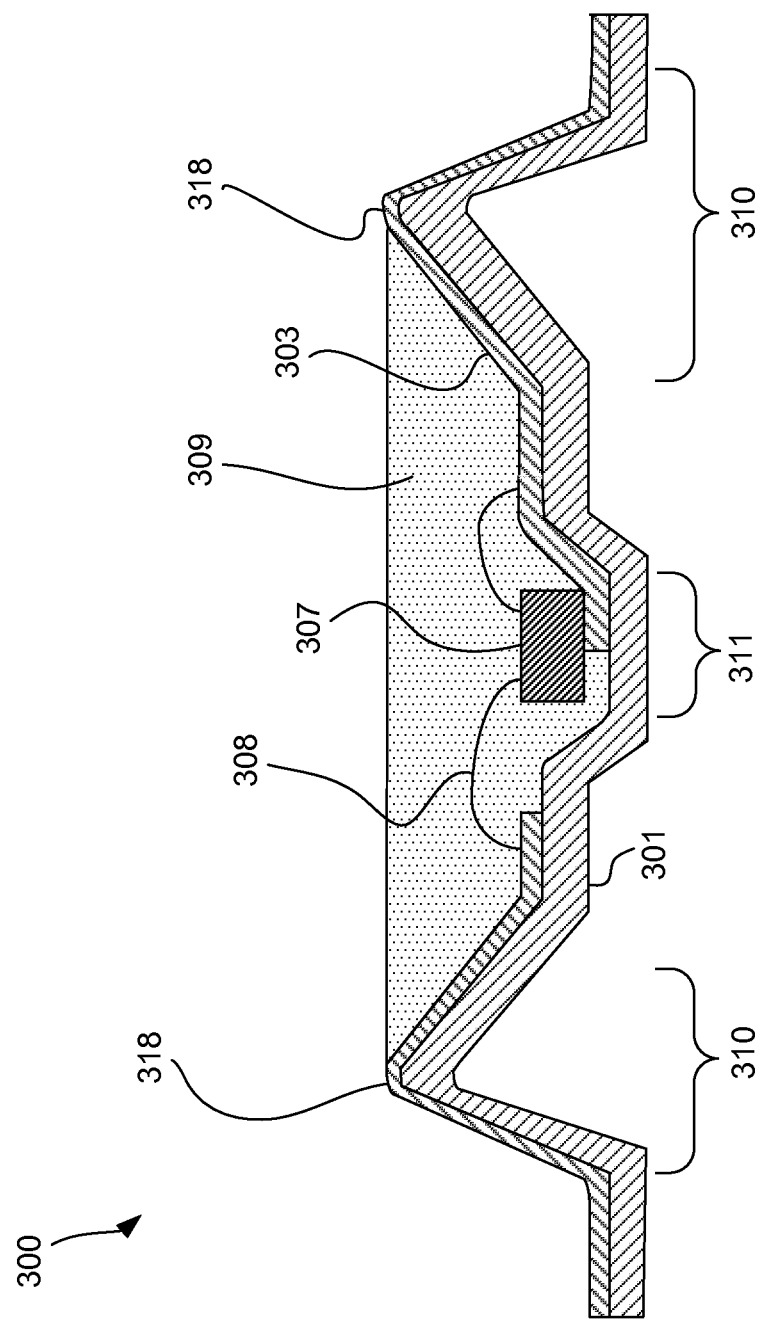
FIG. 3 is a cross-sectional view of another exemplary light source consistent with the present disclosure.

Ridge 218 may in some embodiments define component mounting area 211, e.g., for package 102 as described above. Ridge 218 may therefore be configured so as to define a mounting area 211 that is appropriately sized for the package or electronic component it is to contain. In some embodiments, ridge 218 may be sized such that mounting area is large enough to contain electronic component package, such as LED package 102. Alternatively or additionally, ridge 218 may be placed and/or sized to define a mounting area suitable for a bare electronic component such an LED chip (e.g., LED chip 307 as shown in FIG. 3). In any case, ridge 218 may be configured so as to surround or substantially surround mounting area 211, e.g., as generally shown in FIGS. 4 and 5.

In addition to defining mounting area 211, ridge 218 may define and/or be proximate to one or more flexion zones that may insulate or otherwise protect components within mounting area 211 from forces that may be applied to substrate 201. This concept is illustrated in the embodiment of FIG. 2, wherein substrate 201 is shown as including flexion zone 210. Flexion zone 210 may be configured so as to extend around or substantially around a perimeter of mounting area 211, e.g, as generally shown in FIGS. 4 and 5.

Without limitation, flexion zones may include one or more bends or elbows, which may flex in response to one or more forces applied to substrate 201. By way of example, flexion zone 210 in the embodiment of FIG. 2, includes three elbows 220. When substrate 201 is exposed to forces (e.g., bending force A in FIG. 1), one or more of elbows 220 may expand, contract, flex or otherwise move so as to insulate mounting area 211, package 102 (and more particularly the bond between adhesive 204 and one or more of package 102 and traces 203) from such forces. For example, flexion zones may isolate stress imposed on substrate 201 (e.g., during bending) at one or more elbows of joints thereof, so as to prevent translation of such stress to bonds within mounting area 211. In this way, flexion zones 210 may prevent damage to the bond between adhesive 204 and one or more of package 102 and substrate 201, e.g., when substrate 201 is bent and/or flexed.

Flexion zones 210, mounting area 211 and ridge 218 may be formed in substrate 201 using any suitable process, such as embossing, debossing, etching, three dimensional printing, thermoforming, combinations thereof, and the like. Without limitation, flexion zones 210, mounting area 211 and ridge 218 are preferably formed by embossing or debossing a sheet of shapeable material such as PET. In such instances, the sheet may have been previously processed to include traces 203, e.g., via printing, plating, etching or other deposition process. Alternatively, the sheet material may be processed to include flexion zone 210, mounting area 211, and/or ridge 218, after which traces 203 may be formed on a surface thereof. Without limitation, flexion zone 210, mounting area 211 and ridge 218 may be formed via embossing in a roll to roll manufacturing process, such as will be described later in connection with FIG. 6.

Reference is now made to FIG. 3, which depicts another exemplary light source consistent with the present disclosure. As shown light source 300 includes substrate 301, which includes flexion zone 310, mounting area 311 and ridge 318. Substrate 301 also has traces 303 of a circuit formed on a surface thereof. In general, the type, nature and function of substrate 301, traces 303, flexion zone 310, mounting area 311 and ridge 318 are the same as the corresponding components of FIG. 2, which is described above. A detailed description of such components is therefore not reiterated for the sake of brevity.

In the embodiment of FIG. 3, substrate 301 is configured such that the body and lead frame of package 102 may be omitted. That is, substrate 301 in FIG. 3 is configured such that it may house and retain a bare electronic component, in this case LED chip 307. Indeed as shown, LED chip 307 in this embodiment is mounted directly on a surface of one of traces 303. Of course, LED chip 307 need not be mounted on trace 303, and may be mounted in any suitable manner within mounting area 311. By way of example, LED chip may be mounted directly on a surface of substrate 301 within mounting area 311. In either case, LED chip 307 may be electrically coupled to traces 303 in any suitable manner, such as via wire bonds 308 as shown in FIG. 3. Of course the use of wire bonds is not necessary, and other electrical coupling mechanisms such as die bonding, soldering, etc. may be used to electrically couple LED chip 307 to traces 303.

For the sake of illustration, substrate 301 is illustrated in FIG. 3 as having an interior volume 309 of a similar shape and size as the interior volume of a Duris E5 package available from OSRAM Opto Semiconductors. It should be understood that this illustration is exemplary, and that volume 309 may be of any desired shape and size.

As shown in FIG. 3, substrate 301 may be configured such that it includes a volume 309 above and/or around one or more surfaces of electronic component within mounting area 311, in this case LED chip 307. Although this volume may remain empty if desired, it may also be fully or partially filled with a filling material. The filling material may for example enhance retention of components such as LED chip 307 within mounting area 311, and/or impart other beneficial properties. By way of example, retention of LED chip 307 may be enhanced by filling volume 309 with a filling material having adhesive properties. In any case, the filling material is preferably transparent to light emitted from LED chip 307. As non-limiting examples of such materials, mention is made of silicones, epoxies, other optical encapsulant materials, combinations thereof, and other materials which may be at least partially transparent to light emitted from LED chip 307. Without limitation, a material that is transparent to at least about 90%, 95%, 99%, or even 100% of light emitted from LED chip 307 is preferably used to fill or partially fill volume 309.

In some embodiments, the material used to fill volume 309 may have wavelength converting properties. By way of example, the filling material may include or be formed of one or more wavelength converting materials, which may convert at least one first wavelength or wavelength range of the light emitted from LED chip 307 to at least one second wavelength or wavelength range. As non-limiting examples of wavelength converting materials, mention is made of so-called phosphor in binder materials. Such materials include a binder material such as silicone, which is loaded with particles of one or more wavelength converting phosphors, e.g., cerium-activated yttrium aluminum garnet (YAG:Ce). Alternatively or additionally, the filling material may be in the form of one or more ceramic wavelength converters, which may be machined or otherwise formed so as to fit within volume 309. In any case, fully or partially filling volume 309 with a wavelength converting material may also enhance retention of LED chip 307 within mounting area 311, particularly in instances where the converter is formed from a silicone and/or epoxy binder including phosphor particles.

In a non-limiting preferred embodiment, volume 309 is fully or partially filled with a silicone binder containing particles of a phosphor capable of affecting the spectrum of the light emitted by LED chip 307. For example, LED chip 307 may be capable of emitting light in the blue and/or UV region of electromagnetic spectrum. In such instance, the phosphor particles in the filling material may be excited by the blue and/or UV light emitted by LED chip 307, and emit yellow light, e.g., via phosphorescence. The output light from light source 300 may therefore include a combination of blue and yellow light, which may be perceived by a user as a white light. Other combinations of LED chip and wavelength converting material are of course possible.

Volume 309 may of course be fully or partially filled with other materials, including but not limited to thermally conductive materials. By way of example, volume 309 may be fully or partially filled with a thermally conductive adhesive, such as a thermally conductive epoxy. Alternatively or additionally, the filling material may include thermally conductive but non-adhesive materials, such as but not limited to a thermally conductive paste. Non-limiting examples of such pastes include thermally conductive silver, copper, and/or polymer pastes.

Because the embodiment of FIG. 3 does not include a lead frame, a mechanism may be needed to electrically connect LED chip 307 to traces 303. In the illustrated embodiment, wire bonds 308 are used for this purpose. It should be understood however that wire bonds 308 are not required, and that any suitable mechanism for electrically connecting traces 203 to LED chip 307 may be used, including soldering, die bonding, combinations thereof and the like.

In the embodiments of FIGS. 2 and 3, ridges 218, 318 are each illustrated in the form of a raised ridge which includes a peak that is above a plane of a corresponding mounting surface. Ridges 218, 318 may therefore be understood as raised ridges that protrude from a surface of their corresponding substrate. It should be understood that ridges 218, 318 need not be raised ridges, and that other ridge configurations are possible and envisioned by the present disclosure. By way of example, the ridges described herein may be in the form of depressed ridges, which include a peak that is below a plane of a mounting surface that is defined by the ridge. In other words, a raised ridge may define a mounting area situated in a depression (e.g., dimple) defined within the perimeter of the ridge. In contrast, a depressed ridge may define a mounting area that is defined on a protrusion that extends from a surface of a substrate.

FIGS. 4 and 5 illustrate top down views of two substrates that have been processed to include a mounting area and flexion zone consistent with the present disclosure. For the sake of clarity, such figures depict substrates that include a single mounting area for a single electronic component such as an LED chip or package. These illustrations are exemplary only, and it should be understood that the substrates described herein may be formed to include a plurality of mounting areas, each of which may contain one or more electronic components. Moreover, each mounting area may be defined and/or surrounded by one or more flexion zones, as previously described. In this way, an array of mounting areas defined by flexion components may be defined in a single substrate, with neighboring flexion zones separated by a substantially flat portion of the substrate.

More specifically, FIG. 4 depicts a top down view of substrate 401, which includes traces 403 corresponding to a circuit for driving electronic components mounted thereon. Substrate 401 further includes a first ridge 418, which defines mounting area 411 for LED chip 407, which is mounted on traces 403. As generally shown, first ridge 418 is configured to define the perimeter of mounting area 411 having a rounded rectangular shape. Of course, this shape is exemplary only, and first ridge 418 may be configured to define mounting area 411 with a perimeter having any desired shape. This concept is illustrated in FIG. 5, wherein substrate 501 is illustrated as including a first ridge 518 defining a mounting area 511 with an outer perimeter having a circular shape. Of course, other outer perimeter shapes are also possible, including oval, elliptical, trapezoidal, irregular, and shaped with compound curvature.

As further shown in FIGS. 4 and 5, substrates 401, 501 may optionally include additional ridges, such as optional ridges 418', 418", 518', and 518". Such optional ridges may define mounting areas for other electronic components, and/or may define additional flexion zones in their corresponding substrates. Such additional flexion zones may for example protect components mounted within mounting areas 411, 511 from forces imparted to substrates 401, 501. For example, first ridges 418, 518. As such, optional ridges 418', 418", 518', and 518" may further enhance retention of LED chips 407, 507 within mounting areas 411, 511, respectively.

Of course, the number of ridges illustrated in FIGS. 4 and 5 is exemplary only, and it should be understood that any type and number of ridges may be used around one or more mounting areas. Indeed, the present disclosure envisions embodiments wherein at least about 1, 2, 3, 4, 5, 10, 15 or even 20 ridges and corresponding flexion zones are utilized around 1, 2, 3, 4, or even five or more mounting zones, so as to protect such zones and the components mounted therein from force applied to the substrate, e.g., when the substrate is flexed or otherwise bent.

Another aspect of the present disclosure relates to methods of manufacturing substrates consistent with the present disclosure, as well as electronic component arrays (e.g., a lighting array) utilizing such substrates. In this regard reference is made to FIG. 6, which depicts an exemplary roll to roll process for manufacturing substrates consistent with the present disclosure. As illustrated, one method of manufacturing a substrate consistent with the present disclosure may include introducing a sheet 650 of substrate material into a first set of rollers 651. Sheet 650 may be formed of any material suitable for a substrate consistent with the present disclosure, including those previously described. Without limitation, sheet 650 is a polyester (PET) or polyimide sheet.

First rollers 651 may be configured to print electrical traces on a surface of sheet 650, so as to form patterns of electrical traces and other elements of one or more circuits 652. As previously described, circuits 652 may be configured to control or drive electrical components which may be mounted on the surface of a substrate consistent with the present disclosure, such as an LED package or chip. In particular, circuits 652 may include one or more electrical leads for an electronic component such as an LED package or chip, as previously described in connection with FIGS. 2 and 3.

Figure 6:
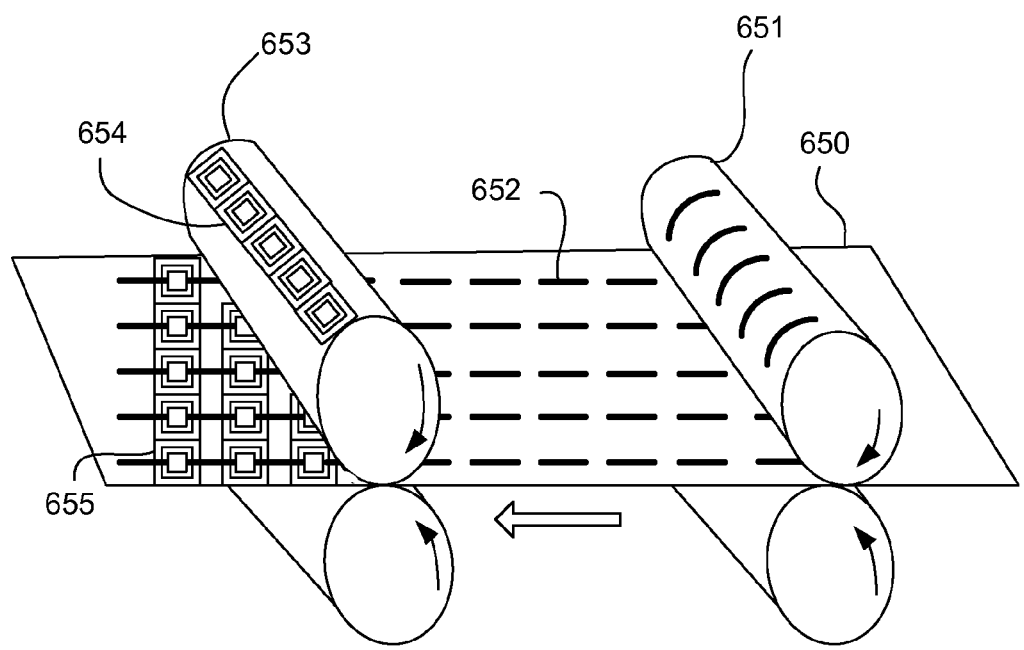
FIG. 6 depicts a roll to roll manufacturing process consistent with the present disclosure.

After circuits 652 are formed on sheet 651, sheet 651 may be translated in a machine direction to a second set of rollers 653. In general, second rollers 653 may be configured to deform sheet 651 so as to produce at least one ridge defining a mounting location for an electronic component. In this regard, second rollers 653 may include for example mating convex and concave dies 654, which may be configured to emboss and/or deboss sheet 651 to form one or more ridges and corresponding mounting locations. This concept is shown in FIG. 6, wherein mounting locations 655 are shown downstream of second rollers 653.

Once at least one ridge and mounting location has been provided in sheet 651, the resulting substrate may be translated or transferred to other machinery for the placement of electronic components such as LED packages and/or chips. For example, sheet 651 may be further translated proximate to pick and place machinery, which may place and bond electronic components one mounting locations 655. Subsequently, the sheet bearing the bonded electronic components may be translated to filling/bonding machinery, which may apply adhesive and/or wavelength converting materials, as desired.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light source comprising:
  a circuit board comprising a flexible substrate with at least one circuit and at least one component mounting area, said at least one circuit including at least first and second electrical leads, said substrate further comprising a a flexion zone having a ridge defining said component mounting area, said ridge protruding from a surface of said substrate and surrounding said component mounting area, said flexion zone configured to insulate said component mounting area from a force imposed on said substrate; and
  a light emitting component positioned within said component mounting area and electrically coupled to said first and second electrical leads.

2. The light source of claim 1, wherein said light emitting component is a light emitting diode chip.

3. The light source of claim 1, wherein said substrate comprises at least one of a polyester and a polyimide.

4. The light source of claim 1, wherein said substrate is formed from biaxially oriented polyethylene terephthalate.

5. The light source of claim 1, wherein said circuit comprises traces formed from a conductive ink.

6. The light source of claim 1, wherein said flexion zone comprises at least one bend, wherein in response to an applied force, said bend may expand, contract, or expand and contract to dissipate at least a portion of said force.

7. The light source of claim 1, wherein said ridge is a raised ridge, a depressed ridge, or a combination thereof.

8. The light source of claim 1, wherein said ridge defines a volume above said component mounting area, and said volume is at least partially filled with an adhesive, a wavelength converting material, or a combination thereof.

9. The light source of claim 1 wherein the flexion zone has more than one elbow.

10. The light source of claim 9 wherein the flexion zone has three elbows.

11. The light source of claim 1 wherein the ridge has a peak that is above a plane of a mounting surface of the component mounting area.

12. The light source of claim 11 wherein the component mounting area comprises a depression.

13. The light source of claim 1 wherein the ridge has a peak that is below a plane of a mounting surface of the component mounting area.

14. The light source of claim 13 wherein the component mounting area comprises a protrusion that extends from a surface of the substrate.

* * * * *